(12) United States Patent
Cowlishaw

(10) Patent No.: US 6,437,715 B1
(45) Date of Patent: Aug. 20, 2002

(54) DECIMAL TO BINARY CODER/DECODER

(75) Inventor: Michael Frederic Cowlishaw, Coventry (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/932,352

(22) Filed: Aug. 17, 2001

(30) Foreign Application Priority Data

Jan. 27, 2001 (GB) ............................................. 0102154

(51) Int. Cl.[7] ................................................ H03M 7/04
(52) U.S. Cl. .......................... 341/105; 341/104; 341/59
(58) Field of Search ................................ 341/105, 104, 341/85, 59, 60, 62, 55, 57; 34/56, 67

(56) References Cited

U.S. PATENT DOCUMENTS

| | | | | |
|---|---|---|---|---|
| 4,972,187 A | * | 11/1990 | Wecker | 341/95 |
| 6,011,873 A | * | 1/2000 | Desai et al. | 382/245 |
| 6,124,811 A | * | 9/2000 | Acharya et al. | 341/63 |
| 6,166,664 A | * | 12/2000 | Acharya | 341/63 |
| 6,348,883 B2 | * | 2/2002 | Okada et al. | 341/59 |

* cited by examiner

*Primary Examiner*—Brian Young
*Assistant Examiner*—John Nguyen
(74) *Attorney, Agent, or Firm*—John L. Rogitz

(57) ABSTRACT

A system and method are provided for encoding from decimal to binary and back again. The coding is based on representing 3 decimal digits as 10 binary bits and is a development of the Chen-Ho algorithm. This provides a storage efficiency of >99%, yet still allows decimal arithmetic to be readily performed. The decimal input is typically first converted to binary coded decimal (4 bits per decimal digit), before compression to 10 bits. Adopting the encoding of the present invention, if the leading (most significant) decimal digit is zero, then the first three bits of the binary output are zero; and if the first two decimal digits are zero, then the first six bits of the binary output are zero. Accordingly, the same coding can be flexibly used to code 2 decimal digits to 7 binary bits, and 1 decimal digit to 4 binary bits. This makes it particularly suitable for standard computer architectures which are based on a power of two (16-bit, 32-bit, 64-bit, etc), and therefore not directly divisible by 7 or by 10.

51 Claims, No Drawings

DECIMAL TO BINARY CODER/DECODER

FIELD OF THE INVENTION

The present invention relates to converting from decimal numbers to binary numbers and vice versa, particularly for use in computing systems and such like.

BACKGROUND OF THE INVENTION

Human mathematics is largely based on the decimal system, presumably due to the biological fact (or accident) that we have five fingers on each of two hands. In contrast, for physical reasons, modern digital computer systems use binary numbers for their internal processing, with a one represented by the presence of a signal, and zero by the absence of a signal (or vice versa). Consequently most numerical input data will be presented to a computer in decimal form. This must then be converted to binary for processing, and then converted back to decimal for output.

There are several known methods of representing decimal numbers as binary numbers. If we simply are considering integers, then clearly there is a direct mapping from a decimal integer to its corresponding binary integer (for example 235 goes to 11101011). Moving on to real numbers, possibly the most natural approach is to introduce a "decimal" point into a binary number, so that the first digit to the right of the "decimal" point represents ½, and the nth digit ½n. One problem with this approach is that 0.1 (in decimal) is a recurring fraction in binary, and so cannot be represented exactly. This leads to the possibility of rounding errors, which can be exacerbated by repeated conversions from decimal to binary and back again.

A slightly different approach is to extend the integer representation to cope with real numbers by separately recording a decimal point position using an integer exponent (this can be regarded as floating point real numbers rather than fixed point). Thus 235 could be 23.5, 2.35, 0.235 etc according to the value of the exponent. This overcomes the recurring fraction problem mentioned above, but is still not completely satisfactory. The conversion between binary and decimal is not particularly simple in terms of hardware design (this sort of facility is nearly always provided in hardware for speed). The reason for this in general terms is that such conversion requires binary addition rather than simple bit manipulation. Also, it is relatively common to have to truncate or round decimal numbers for output, and there is no quick way of performing such truncation or rounding with this coding technique (ie without first performing a conversion of a full number). For example 01111111, as representing 1.27 with a suitable exponent, rounds to 1.3, but 01111100, representing 1.24, rounds to 1.2.

One way around these problems is to use binary coded decimal. Here each decimal digit (0–9) is encoded by a corresponding four bit binary number, so that a sequence of decimal digits can then be represented by concatenating the four-bit binary numbers. This allows quick retrieval of any given decimal digit independently from the others, and so provides for simple rounding and truncation. However, this has been achieved at the expense of a significant loss of storage efficiency. Thus potentially four bits can store 0–15, rather than 0–9.

We can formally measure storage efficiency by observing that the number of digits $N_r$ needed to store an integer X using base r goes as $N_r \vert \log_r(X)$. Asymptotically therefore (ie for very large numbers) the ratio of digits used for binary storage of a given number to decimal storage of that number is:

| $N_2/N_{10}$ | $\vert \log_2(X)/\log_{10}(X)$ |
|---|---|
| | $\vert (\log_{10}(X)/\log_{10}(2))/\log_{10}(X)$ |
| | $\vert 1/\log_{10}(2) \vert 3.322$ |

Since binary coded decimal has a ratio of 4 between the number of binary digits and the number of decimal digits, this gives an efficiency of only 3.322/4=0.83. Expressed another way, a 32 bit system, which in theory could store 4,294,967,295 as a binary integer, can now only store 99,999,999 as a decimal integer, a reduction in terms of maximum number of a factor $\vert 40$. In order to overcome this deficiency, a sort of hybrid algorithm was developed by Chen and Ho (see Communications of the ACM, January 1975, v18/1, p49–52). This is based on the fact that $2^{10}=1024\vert 10^3$ (this correspondence of course underlies all computer storage sizings—thus 8 kBytes really corresponds to 8*1024 Bytes rather than 8000 Bytes). Accordingly, the Chen-Ho algorithm takes three decimal digits, and then encodes them into 10 binary bits. This allows relatively quick retrieval of the decimal digits in any given location, by simply decoding the corresponding 10 binary bits, but retains a high (asymptotic maximum) storage efficiency of $3.322/(10/3)=99.66\%$.

The Chen-Ho algorithm is best understood as a mapping from a decimal coded binary number having 12 bits, corresponding to 3 decimal digits each represented by 4 binary bits, into a 10 bit binary number. Thus the input to the algorithm can be written as (abcd), (efgh), (ijkl), where each bracketed group of four letters corresponds to the decimal coded binary representation of the equivalent decimal digit. The 10 output bits can then be denoted as pqrstuvwxy. The details of the mapping from the input string to the output string are set out in Table 1 below.

TABLE 1

| a | e | i | p | q | r | s | t | u | v | w | x | y |
|---|---|---|---|---|---|---|---|---|---|---|---|---|
| 0 | 0 | 0 | 0 | b | c | d | f | g | h | j | k | l |
| 1 | 0 | 0 | 1 | 0 | 0 | d | f | g | h | j | k | l |
| 0 | 1 | 0 | 1 | 0 | 1 | d | b | c | h | j | k | l |
| 0 | 0 | 1 | 1 | 1 | 0 | d | f | g | h | b | c | l |
| 0 | 1 | 1 | 1 | 1 | 1 | d | 0 | 0 | h | b | c | l |
| 1 | 0 | 1 | 1 | 1 | 1 | d | 0 | 1 | h | f | g | l |
| 1 | 1 | 0 | 1 | 1 | 1 | d | 1 | 0 | h | j | k | l |
| 1 | 1 | 1 | 1 | 1 | 1 | d | 1 | 1 | h | 0 | 0 | 1 |

The Chen-Ho algorithm is based on the observation that decimal digits 0–7 can be encoded in 3 binary bits; these decimal digits are therefore considered as "small", whilst decimal digits 8 and 9 are considered as "large". If a decimal digit is small, then its first bit (when represented in binary) is zero; if it is large, then its first bit is one, but the next two bits are always zero (since individual numbers above 9 are not required in the decimal system). Thus the first bit for each binary coded decimal determines whether the number is small (zero) or large (one), and is known as the indicator bit. For three decimal digits there are a total of $2^3=8$ possibilities as to the values of the three indicator bits, and these correspond to the 8 lines in Table 1. In other words, which line of the table is used to perform the mapping depends on the values of the indicator bits. If all three decimal digits are small (51.2% of possibilities), corresponding to the first line in the table, then this is indicated by a 0 in the p output position. The remaining 9 bits are then divided into three groups of 3, which indicate in standard fashion the value of each of the decimal digits (these must all be in the range 0–7, since all of the decimal digits are small). If just one of the decimal digits is large (38.4% of possibilities), then p is set to 1. The next two bits (q and r) are then set to 00, 01, or 10, to indicate which of the three decimal digits is large (the first, second or third respectively). The remaining 7 bits are split up into two groups of 3, to encode the two small digits, plus 1 additional bit to encode the large digit. (It will be appreciated that since there are only two possibilities for a large decimal, 8 or 9, then the actual value can be represented by a single bit, corresponding to the final bit in the binary coded digital—ie d, h or l as appropriate).

If two of the decimal digits are large (9.6% of possibilities), then p, q, and r are all set to 1. A further two bits (t and u) are then set to 00, 01, 10 to indicate the position of the one small decimal digit (first, second or third digit). This leaves a final 5 bits, of which 3 are used to encode the one small digit, and each of the remaining 2 bits is assigned to one of the two large digits.

Finally, if all three of the decimal digits are large (0.8% of possibilities) then p, q, r, t and u are all set to 1. Of the remaining 5 bits, three are used to encode one each of the three large digits, and the remaining two (w and x) are set to zero.

An appropriate decoding algorithm for going back from Chen-Ho to binary coded decimal can be obtained in a straightforward manner effectively by inverting the contents of Table 1 and is given in their paper. Note that for this purpose, it is first necessary to determine which line of the table was used for the encoding. This can be ascertained by looking initially at the value of the p bit; and if this is 1, at the values of the q and r bits; and if these are both 1 as well, at the values of the t and u bits. Thus the p bit can be regarded as the primary indicator field, and q, r, t and u as a secondary indicator field.

Chen and Ho observe that their indicator field can be regarded as a form of Huffman coding, in that it has a variable length which is shortest for the most likely data values, with less probable values having increasingly greater length. Moreover, the values of the indicator field are carefully selected so that they can always be properly distinguished from one another. However, overall Chen-Ho is not a form of Huffman compression, in that it works by eliminating the inoperative bit combinations of binary coded decimal. (In contrast Huffman compression assigns a short code to common symbols, and a longer code to rare symbols, to derive an overall benefit in terms of the statistical average code length).

An important advantage of the Chen-Ho algorithm is that there are only binary shifts, insertions and deletions, based on the testing of the 3 indicator bits (a, e and i). Moreover, it will be appreciated that the bit assignments outside the indicator fields have been designed to simplify the bit mapping as much as possible. Thus bits d, h and l (the least significant bits in each input decimal digit) always map straight through to bits s, v and y respectively. Overall therefore, a very fast efficient hardware implementation of the coding is possible.

Note that certain other schemes for encoding 3 decimal digits into 10 binary digits are also known in the art. Thus U.S. Pat. No. 3,618,047 describes a coding system, based on very similar principles to Chen-Ho. It is also pointed out by Smith (see Communications of the ACM, August 1975, v18/8, p463) that it would be possible to simply treat each three decimal digits as an integer in the range 0–999, and then convert to the corresponding binary integer. This makes the conversion from decimal to binary and vice versa conceptually very simple. However, the operations involved in the conversion from decimal coded binary into compressed binary and back again are significantly more complex than that required for Chen-Ho. The above-mentioned two papers, by Chen-Ho and Smith, also discuss the possibility of variable length coding, in other words where N decimal digits are encoded to a variable length binary string. However such schemes are difficult to incorporate into standard computer systems, and will not be discussed further herein. One drawback with the Chen-Ho algorithm described above is that it only works in relation to converting groups of three decimal digits into 10 binary bits. However, computer architectures are almost exclusively sized around powers of two (16-bit, 32-bit, 64-bit) and accordingly these sizings will not actually be directly divisible by 10. Straightforward use of the Chen-Ho algorithm described above would simply waste any remaining bits. For example, on a 64-bit system only 6*3=18 decimal digits could be stored using 60 of the 64 available bits. Whilst this is certainly an improvement on the 16 decimal digits obtainable with binary coded decimal, the practical storage efficiency here has decreased to 3.322/(64/18)|0.93, significantly below the theoretical maximum. In fact both Chen-Ho (in the same paper referenced above) and U.S. Pat. No. 3,618,047 also describe an algorithm for coding 2 decimal digits into 7 bits, which is based on the same principles as the 3 to 10 algorithm (splitting according to large/small decimals). Furthermore U.S. Pat. No. 3,618,047 contemplates combining the 3 and 2 digit algorithms, suggesting that 11 decimal digits could be broken into 3 groups of 3 digits and 1 group of 2 digits. As another example, a 64-bit space could be split up as (5*10)+(2*7) to allow coding of 19 decimal digits; the same number of decimal digits could also be obtained by splitting the 64-bit space as (6*10)+(1*4), where the 4-bit coding is simply standard binary decimal coding. Actually 19 is the maximum possible number of complete decimal digits that can be encoded in 64 bits (since $64 * \log_{10}(2) = 19.27$—ie less than 20), so both these approaches are theoretically optimal.

However, such a combination of different coding (and decoding) patterns compromises the simplicity which was one of the major initial attractions of the Chen-Ho algorithm.

SUMMARY OF THE INVENTION

Accordingly, the present invention provides a method of converting decimal digits into binary, said method comprising the steps of:

receiving one, two or three decimal digits;

encoding said decimal digits into ten binary bits using an encoding scheme such that if there is one decimal digit, the first six binary bits are zero, and if there are two decimal digits, the first three binary bits are zero; and outputting said ten binary bits.

Use of the above encoding scheme allows a single efficient scheme to be used for coding an arbitrary number of decimal digits. The same scheme can be used for automatically encoding one, two or three decimal digits, with larger numbers of decimal digits broken down into groups of three (plus one or two remainder). Note that typically the received decimal digits are in the form of binary coded decimal numbers.

In a preferred embodiment, if fewer than three decimal digits are received, these can be padded with zeros, to provide a consistent input size of three digits (or twelve bits if binary coded decimal input is used). This is particularly useful where the encoding is performed in fixed hardware; in contrast, such padding may not be necessary if the coding is done in software, for example via a lookup table.

In accordance with a preferred embodiment of the present invention, the ten binary bits output include a primary indicator field. Contrary to prior art systems such as Chen-Ho, this primary indicator field is not located at the front of said ten binary bits (ie at the most significant bit value), but rather is located within the bit sequence. In the preferred implementation described below, the primary indicator field is the seventh bit in the ten bit sequence (note that this means that it is outside the set of bit positions which have to go to zero if only one or two decimal digits are being encoded).

The purpose of the primary indicator field is to indicate whether or not the three decimal digits are all small, where a decimal digit is regarded as small if it is in the range 0–7, and large if it is 8 or 9 (analogous to Chen-Ho).

If the three decimal digits are not all small, then a secondary indicator field of two bits is included in the ten binary bits. This field has a first value to indicate that more than one of said decimal digits is large, and second, third and fourth values to indicate which of said three decimal digits is large, if just one of said decimal digits is large. In the preferred embodiment the two bits of the secondary indicator comprise the eighth and ninth bits of said ten binary bits (again outside the set of bit positions which have to go to zero if only one or two decimal digits are being encoded).

If two or more of the decimal digits are large, a tertiary indicator field of two further bits is provided in the ten output bits. This field has a first value to indicate that all three of said decimal digits are large, and second, third and fourth values to indicate which of the decimal digits is small, if just one of the decimal digits is small. In the preferred embodiment, the two bits of the tertiary indicator comprise the fourth and fifth bits of the ten binary bits.

The invention further provides a method of converting binary bits into decimal digits (ie conversion in the opposite direction to that performed above). This involves the steps of: receiving ten binary bits; decoding said ten binary bits into three decimal digits, by performing the inverse operation to the encoding described above; and outputting said three decimal digits. The first logical step of said decoding is preferably to examine the value of an indicator bit (the primary indicator field). Typically the three decimal digits are output in the form of binary coded decimal (again this is particularly likely to be the case for hardware embodiments).

The invention further provides a computer program for implementing the methods described above. Such a program can be supplied as a computer program product, representing a set of program instructions encoded into a machine-readable storage medium such as a CD ROM, DVD or diskette. The instructions are then loaded into the computer or other host device by reading from the storage medium, causing the host device to perform the processing of the method. Note that such instructions can also be preloaded into a computer (eg encoded on a ROM), or downloaded into the computer over a network such as the Internet via a local area network (LAN), wireless link, or any other suitable form of connection.

Corresponding to the encoding method of the invention, there is further provided a system for converting decimal digits into binary, said system comprising:

means for receiving one, two or three decimal digits;

means for encoding said decimal digits into ten binary bits using an encoding scheme such that if there is one decimal digit, the first six binary bits are zero, and if there are two decimal digits, the first three binary bits are zero; and means for outputting said ten binary bits.

Corresponding to the decoding method of the invention, there is further provided a system for converting binary bits into decimal digits, said system comprising:

means for receiving ten binary bits;

means for decoding said ten binary bits into three decimal digits, by performing the inverse operation to the encoding described above (wherein the first logical step of said decoding is to examine the value of an indicator bit not located at the front of said ten binary bits); and means for outputting said three decimal digits.

A preferred embodiment of the invention will now be described in detail by way of example only.

The coding scheme of the present invention is based on the bit mappings set out in Table 2. The notation here is the same as that used in Table 1, in that it is assumed that three binary coded decimal digits (abcd), (efgh), (ijkl) are encoded into a ten bit output string (pqrstuvwxy).

TABLE 2

| a | e | i | p | q | r | s | t | u | v | w | x | y |
|---|---|---|---|---|---|---|---|---|---|---|---|---|
| 0 | 0 | 0 | b | c | d | f | g | h | 0 | j | k | 1 |
| 0 | 0 | 1 | b | c | d | f | g | h | 1 | 0 | 0 | 1 |
| 0 | 1 | 0 | b | c | d | j | k | h | 1 | 0 | 1 | 1 |
| 1 | 0 | 0 | j | k | d | f | g | h | 1 | 1 | 0 | 1 |
| 1 | 1 | 0 | j | k | d | 0 | 0 | h | 1 | 1 | 1 | 1 |
| 1 | 0 | 1 | f | g | d | 0 | 1 | h | 1 | 1 | 1 | 1 |
| 0 | 1 | 1 | b | c | d | 1 | 0 | h | 1 | 1 | 1 | 1 |
| 1 | 1 | 1 | 0 | 0 | d | 1 | 1 | h | 1 | 1 | 1 | 1 |

In the encoding scheme of Table 1, compression of one or two decimal digits into 4 or 7 bits respectively is achieved as a right-aligned subset of the 3-digit coding. This allows an arbitrary number of decimal digits to be efficiently encoded. Short decimal numbers can be expanded into a longer field simply by padding with zero bits.

For example, 38 decimal digits can be encoded into 128 bits (38=12*3+1*2, corresponding to 127 bits, leaving one bit for a sign). In one preferred embodiment, 33 digit decimal numbers plus exponent are stored into a 128 bit field using the encoding of the present invention (NB certain languages such as COBOL specifically require 32-digit arithmetic, so the ability to fit this into 128 bit registers is particularly useful).

It will be appreciated that there are many variations on the bit mappings of Table 2 which will maintain these properties. If we consider three main categories:

(a) redundant bits: given that 10 bits can represent 1024, and we only need 1000 possibilities for the 3 decimal digits, certain binary combinations are in fact redundant, and are therefore interchangeable. For example, in the final row of the table, the values of bits a and b have been arbitrarily set to zero, but could have any value without affecting the code (note that since the final row only relates to situations where all three decimal digits are large, ie 8 or 9, there is no need for leading zeros here).

(b) bit inversions: it is clearly possible to invert some bit mappings—for example bit y could go as the inverse of bit 1, rather than as a direct mapping, either throughout, or just for selected rows. Likewise certain components of the indicator fields could also be inverted throughout from the values shown, such as the primary indicator field (v), or the secondary indicator bits w and x (these would have to inverted as a pair). Note that since bits v, w and x are all within the last four positions, their values will never be part of leading zeros if fewer than three decimal values are being mapped.

(c) bit rearrangements: consider the first line of the table—it would clearly be possible to store bits j, k and l in any of bits w, x and y, without impacting the leading zeros for less than three decimal digits (eg j, k and l mapping to bits x, w and y respectively). Indeed more complex bit mappings using some combinatorial logic could also be employed.

It will be recognised therefore that based on the above principles, and potentially combining the different categories of variation, or adopting other ones, the skilled person will be able to develop from Table 2 a variety of other mappings which have the ability to simultaneously handle one, two or three decimal digits. In other words, the particular coding scheme shown in Table 2 is not unique, but only illustrative of the invention.

Nevertheless, the mapping of Table 2 is used in the preferred embodiment since it possesses two additional advantages. Firstly, the bit mappings are relatively straightforward (such as l always mapping directly to y), thereby reducing hardware complexity and cost. Secondly, all numbers from 0 through to 79, which only utilise the first two lines of Table 2, effectively map directly from their binary coded decimal value simply by dropping the leading zeros to go from twelve bits down to ten (in contrast Chen-Ho only provides such a direct mapping for numbers up to 5). Consequently, conversions on small numbers (which tend to be very common) can be performed particularly simply.

The corresponding decoding scheme for mapping back from the encoding of Table 2 to binary coded decimal is shown in Table 3 below (where "." means don't care):

TABLE 3

| v | w | x | s | t | a | b | c | d | e | f | g | h | i | j | k | l |
|---|---|---|---|---|---|---|---|---|---|---|---|---|---|---|---|---|
| 0 | . | . | . | . | 0 | p | q | r | 0 | s | t | u | 0 | w | x | y |
| 1 | 0 | 0 | . | . | 0 | p | q | r | 0 | s | t | u | 1 | 0 | 0 | y |
| 1 | 0 | 1 | . | . | 0 | p | q | r | 1 | 0 | 0 | u | 0 | s | t | y |
| 1 | 1 | 0 | . | . | 1 | 0 | 0 | r | 0 | s | t | u | 0 | p | q | y |
| 1 | 1 | 1 | 0 | 0 | 1 | 0 | 0 | r | 1 | 0 | 0 | u | 0 | p | q | y |
| 1 | 1 | 1 | 0 | 1 | 1 | 0 | 0 | r | 0 | p | q | u | 1 | 0 | 0 | y |
| 1 | 1 | 1 | 1 | 0 | 0 | p | q | r | 1 | 0 | 0 | u | 1 | 0 | 0 | y |
| 1 | 1 | 1 | 1 | 1 | 1 | 0 | 0 | r | . | 0 | 0 | u | 1 | 0 | 0 | y |

The logical operations for deriving the output bits in accordance with the above mapping of Table 2 can be expressed as follows (where "&" AND, OR, and "|"=NOT):

p=(b & \a)|(j & a & \i)|(f & a & \e & i)
q=(c & \a)|(k & a & \i)|(g & a & \e & i)
r=d
s=(f & \e & \(a & i))|(j & (\a & e & \i))|(e & i)
t=(g & \e & \(a & i))|(k & (\a & e & \i))|(a & i)
u=h
v=a|e|i
w=a|(e & i)|(j & \e & \i)
x=e|(a & i)|(k & \a & \i)
y=l

The decoding operations for converting back from the 10 binary bits (pqrstuvwxy) to standard binary coded decimal (abcd), (efgh), (ijkl)—ie the mapping of Table 3—can be performed as follows:

a=(v & w) & (\x|s (s & t))
b=p & (\v|\w (v & w & x & s & \t))
c=q & (\v|\w (v & w & x & s & \t))
d=r
e=v & ((\w & x)|(w & x & (s|\t)))
f=(s & (\v|(v & \x)))|(p & v & w & x & \s & t)
g=(t & (\v|(v & \x)))|(q & v & w & x & \s & t)
h=u
i=v & ((\w & \x)|(w & x & (s|t)))
j=(w & \v)|(s & v & \w & x)|(p & v & w & (\x|(\s & \t)))
k=(x & \v)|(t & v & \w & x)|(q & v & w & (\x|(\s & \t)))
l=y

It will be appreciated that these expressions for encoding and decoding can be manipulated into various logical equivalents using standard boolean techniques. It will also be recognised that the expressions effectively define a hardware encoder/decoder respectively, comprising appropriate gates connected together and with inputs/outputs as specified. For software implementation it may be faster to generate a lookup table (eg a hash table) from the above mappings. Note that this lookup table could clearly go straight from decimal to the binary coding (ie without using binary coded decimal as an intermediate step). In principle one could also create hardware to do this, although this may not be worthwhile given the complexity of designing hardware to natively process decimal numbers (in other words the intermediate conversion to binary coded decimal will generally be beneficial for hardware implementations). It will also be appreciated that combined software/hardware implementations may be desirable, depending on circumstances, for example a software conversion from decimal to binary coded decimal, and then a hardware conversion according to the compression detailed in Table 2.

One example of the use of the present invention would be in a database, where it might be designed to keep decimal digits in their true form (particularly bearing in mind that sometimes these can represent account numbers and so on, rather than simple numerical quantities). The encoding here could be used to efficiently save or store the data (ie using as little storage space as possible), whilst still retaining its decimal nature. In these circumstances, the encoding is performed when the database writes out a data file for storage, and the decoding is performed when the database reads in a stored data file for processing.

The decoding for processing can either be performed in software, for example by a library of C routines, or by a suitable hardware structure. Typically after processing the numbers would then be re-encoded as described herein for subsequent storage. Where hardware is being used, the decoded number would only generally be needed for the specific arithmetic operation to be performed. In other words, the compressed form would be read from storage into a register, and only needs to be decoded for the relevant arithmetic operation (eg "add"); the result of this operation can then be re-encoded a part of writing the result back to a register.

Another example of the use of the present invention is to provide a machine-independent encoding of decimal numbers. This can then be used to transfer such numbers between machines. A somewhat similar application would be on the Internet or Worldwide Web, where it is desirable to perform processing on a variety of client devices. An example here would be processing decimal numbers in XML forms included as part of html pages.

Note that the coding scheme of the invention is applicable to a very wide range of devices. This includes not only computers, ranging in size from palmtops through to personal computers, workstations, servers and mainframes, but also other devices (typically microprocessor or DSP based) which may want to perform decimal arithmetic, such as point of sale terminals, car navigation systems, personal digital assistants, and so on. Note also that there may be certain specialised devices or applications (particularly for data input or output) which perform either coding or decoding in accordance with the present invention, but not both.

To summarise therefore the coding scheme disclosed herein has a wide range of applications, and may be implemented in hardware, software or a combination of the two. A preferred format for the encoding is set out in Table 2, but it will be appreciated that this is exemplary only. The skilled person will be aware of various modifications to the precise implementations described above that remain within the scope of the invention, which is defined in the attached claims.

What is claimed is:

1. A method of converting decimal digits into binary, said method comprising the steps of:
   receiving one, two or three decimal digits;
   encoding said decimal digits into ten binary bits using an encoding scheme such that if there is one decimal digit, the first six binary bits are zero, and if there are two decimal digits, the first three binary bits are zero; and
   outputting said ten binary bits.

2. The method of claim 1, further comprising the steps of:
   padding the received decimal digits with two zeros if one decimal digit is received, prior to said encoding step; and
   padding-the received decimal digit with one zero if two decimal digits are received, prior to said encoding step.

3. The method of claim 1, wherein the ten binary bits output include a primary indicator field, said primary indicator field not being the first of said ten binary bits.

4. The method of claim 3, wherein said primary indicator field is not the last of said ten binary bits.

5. The method of claim 4, wherein said primary indicator field comprises the seventh of said ten binary bits.

6. The method of claim 3, wherein said primary indicator field indicates whether or not the three decimal digits are all small.

7. The method of claim 6, wherein a decimal digit is regarded as small if it is in the range 0–7, and large if it is 8 or 9.

8. The method of claim 7, wherein if said three decimal digits are not all small, then said ten binary bits include a secondary indicator field.

9. The method of claim 8, wherein said secondary indicator field comprises two bits.

10. The method of claim 9, wherein said secondary indicator field has a first value to indicate that more than one of said decimal digits is large, and second, third and fourth values to indicate which of said three decimal digits is large, if just one of said decimal digits is large.

11. The method of claim 8, wherein said two bits of the secondary indicator comprise the eighth and ninth bits of said ten binary bits.

12. The method of claim 8, wherein if two or more of said decimal digits are large, said ten binary bits include a tertiary indicator field.

13. The method of claim 12, wherein said tertiary indicator field comprises two bits.

14. The method of claim 13, wherein said tertiary indicator field has a first value to indicate that all three of said decimal digits are large, and second, third and fourth values to indicate which of said decimal digits is small, if just one of said decimal digits is small.

15. The method of claim 13, wherein said two bits of the tertiary indicator comprise the fourth and fifth bits of said ten binary bits.

16. The method of claim 1, wherein said ten binary bits correspond to the binary decimal coding of said decimal digits, for all decimal numbers in the range 0–79.

17. The method of claim 1, wherein the received decimal digits are in the form of binary coded decimal numbers.

18. A system for converting decimal digits into binary, said system comprising:
   means for receiving one, two or three decimal digits;
   means for encoding said decimal digits into ten binary bits using an encoding scheme such that if there is one decimal digit, the first six binary bits are zero, and if there are two decimal digits, the first three binary bits are zero; and
   means for outputting said ten binary bits.

19. The system of claim 18, further comprising:
   means for padding the received decimal digits with two zeros if one decimal digit is received, prior to said encoding; and
   means for padding the received decimal digit with one zero if two decimal digits are received, prior to said encoding.

20. The system of claim 18, wherein the ten binary bits output include a primary indicator field, said primary indicator field not being the first of said ten binary bits.

21. The system of claim 20, wherein said primary indicator field is not the last of said ten binary bits.

22. The system of claim 21, wherein said primary indicator field comprises the seventh of said ten binary bits.

23. The system of claim 20, wherein said primary indicator field indicates whether or not the three decimal digits are all small.

24. The system of claim 23, wherein a decimal digit is regarded as small if it is in the range 0–7, and large if it is 8 or 9.

25. The system of claim 24, wherein if said three decimal digits are not all small, then said ten binary bits include a secondary indicator field.

26. The system of claim 25, wherein said secondary indicator field comprises two bits.

27. The system of claim 26, wherein said secondary indicator field has a first value to indicate that more than one of said decimal digits is large, and second, third and fourth values to indicate which of said three decimal digits is large, if just one of said decimal digits is large.

28. The system of claim 25, wherein said two bits of the secondary indicator comprise the eighth and ninth bits of said ten binary bits.

29. The system of claim 25, wherein if two or more of said decimal digits are large, said ten binary bits include a tertiary indicator field.

30. The system of claim 29, wherein said tertiary indicator field comprises two bits.

31. The system of claim 30, wherein said tertiary indicator field has a first value to indicate that all three of said decimal digits are large, and second, third and fourth values to indicate which of said decimal digits is small, if just one of said decimal digits is small.

32. The system of claim 30, wherein said two bits of the tertiary indicator comprise the fourth and fifth bits of said ten binary bits.

33. The system of claim 18, wherein said ten binary bits correspond to the binary decimal coding of said decimal digits, for all decimal numbers in the range 0–79.

34. The system of claim 18, wherein the received decimal digits are in the form of binary coded decimal numbers.

35. A computer program product for coverting decimal digits into binary comprising program instructions encoded in machine readable form on a medium, said instructions when executed by a machine causing it to perform the steps of:

receiving one, two or three decimal digits;

encoding said decimal digits into ten binary bits using an encoding scheme such that if there is one decimal digit, the first six binary bits are zero, and if there are two decimal digits, the first three binary bits are zero; and outputting said ten binary bits.

36. The computer program product of claim 35, wherein send instructions further cause the machine to perform the steps of:

padding the received decimal digits with two zeros if one decimal digit is received, prior to said encoding step; and padding the received decimal digit with one zero if two decimal digits are received, prior to said encoding step.

37. The computer program product of claim 35, wherein the ten binary bits output include a primary indicator field, said primary indicator field not being the first of said ten binary bits.

38. The computer program product of claim 37, wherein said primary indicator field is not the last of said ten binary bits.

39. The computer program product of claim 38, wherein said primary indicator field comprises the seventh of said ten binary bits.

40. The computer program product of claim 37, wherein said primary indicator field indicates whether or not the three decimal digits are all small.

41. The computer program product of claim 40, wherein a decimal digit is regarded as small if it is in the range 0–7, and large if it is 8 or 9.

42. The computer program product of claim 41, wherein if said three decimal digits are not all small, then said ten binary bits include a secondary indicator field.

43. The computer program product of claim 42, wherein said secondary indicator field comprises two bits.

44. The computer program product of claim 43, wherein said secondary indicator field has a first value to indicate that more than one of said decimal digits is large, and second, third and fourth values to indicate which of said three decimal digits is large, if just one of said decimal digits is large.

45. The computer program product of claim 41, wherein said two bits of the secondary indicator comprise the eighth and ninth bits of said ten binary bits.

46. The computer program product of claim 42, wherein if two or more of said decimal digits are large, said ten binary bits include a tertiary indicator field.

47. The computer program product of claim 46, wherein said tertiary indicator field comprises two bits.

48. The computer program product of claim 47, wherein said tertiary indicator field has a first value to indicate that all three of said decimal digits are large, and second, third and fourth values to indicate which of said decimal digits is small, if just one of said decimal digits is small.

49. The computer program product of claim 47, wherein said two bits of the tertiary indicator comprise the fourth and fifth bits of said ten binary bits.

50. The computer program product of claim 35, wherein said ten binary bits correspond to the binary decimal coding of said decimal digits, for all decimal numbers in the range 0–79.

51. The computer program product of claim 35, wherein the received decimal digits are in the form of binary coded decimal numbers.

* * * * *